United States Patent
Umeda et al.

(10) Patent No.: US 11,897,817 B2
(45) Date of Patent: Feb. 13, 2024

(54) CERAMIC SINTERED BODY AND SUBSTRATE FOR SEMICONDUCTOR DEVICE

(71) Applicants: NGK INSULATORS, LTD., Nagoya (JP); NGK ELECTRONICS DEVICES, INC., Mine (JP)

(72) Inventors: Yuji Umeda, Mine (JP); Jyunji Oogami, Mine (JP)

(73) Assignees: NGK INSULATORS, LTD., Nagoya (JP); NGK ELECTRONICS DEVICES, INC., Mine (JP)

(*) Notice: Subject to any disclaimer, the term of this patent is extended or adjusted under 35 U.S.C. 154(b) by 387 days.

(21) Appl. No.: 17/317,986

(22) Filed: May 12, 2021

(65) Prior Publication Data

US 2021/0261473 A1    Aug. 26, 2021

Related U.S. Application Data

(63) Continuation of application No. PCT/JP2018/044942, filed on Dec. 6, 2018.

(51) Int. Cl.
*C04B 37/02* (2006.01)
*H01L 23/373* (2006.01)
*C04B 35/119* (2006.01)

(52) U.S. Cl.
CPC .......... *C04B 37/021* (2013.01); *C04B 35/119* (2013.01); *H01L 23/3735* (2013.01);
(Continued)

(58) Field of Classification Search
CPC . H01L 23/3735; C04B 37/021; C04B 37/119; C04B 2235/3201;
(Continued)

(56) References Cited

U.S. PATENT DOCUMENTS

| 4,285,732 A | 8/1981 | Charles et al. |
| 2012/0077023 A1 | 3/2012 | Nagahiro et al. |

(Continued)

FOREIGN PATENT DOCUMENTS

| CN | 105683124 A | 6/2016 |
| EP | 2 637 204 A1 | 9/2013 |

(Continued)

OTHER PUBLICATIONS

International Preliminary Report received in corresponding International Application No. PCT/JP2018/044942 dated Jun. 17, 2021.
(Continued)

*Primary Examiner* — Timor Karimy

(74) *Attorney, Agent, or Firm* — MATTINGLY & MALUR, PC

(57) ABSTRACT

In a ceramic sintered body, the Zr content is 17.5 mass %-23.5 mass % in terms of $ZrO_2$, the Hf content is 0.3 mass %-0.5 mass % in terms of $HfO_2$, the Al content is 74.3 mass %-80.9 mass % in terms of $Al_2O_3$, the Y content is 0.8 mass %-1.9 mass % in terms of $Y_2O_3$, the Mg content is 0.1 mass %-0.8 mass % in terms of MgO, the Si content is 0.1 mass %- and 1.5 mass % in terms of $SiO_2$, and the Ca content is 0.03 mass %-0.35 mass % in terms of CaO. The total content of Na and K is 0.01 mass %-0.10 mass %, when the K content is converted to $K_2O$ and the Na content is converted to $Na_2O$. The balance content is 0.05 mass % or less in terms of oxide.

9 Claims, 3 Drawing Sheets

(52) U.S. Cl.
CPC ............... *C04B 2235/3201* (2013.01); *C04B 2235/3206* (2013.01); *C04B 2235/3208* (2013.01); *C04B 2235/3222* (2013.01); *C04B 2235/3225* (2013.01); *C04B 2235/3244* (2013.01); *C04B 2235/3418* (2013.01); *C04B 2235/765* (2013.01); *C04B 2237/343* (2013.01); *C04B 2237/402* (2013.01); *C04B 2237/407* (2013.01)

(58) Field of Classification Search
CPC .... C04B 2235/3206; C04B 2235/3208; C04B 2235/3222; C04B 2235/3244; C04B 2235/3418; C04B 2235/765
See application file for complete search history.

(56) References Cited

U.S. PATENT DOCUMENTS

| | | |
|---|---|---|
| 2015/0230334 A1 | 8/2015 | Schmidt et al. |
| 2016/0185666 A1 | 6/2016 | San-Miguel et al. |

FOREIGN PATENT DOCUMENTS

| | | |
|---|---|---|
| EP | 3315476 A1 | 5/2018 |
| JP | 56-140072 A | 11/1981 |
| JP | 06-107454 A | 4/1994 |
| JP | 4717960 B2 | 7/2011 |
| JP | 2013-199415 A | 10/2013 |
| JP | 2015-534280 A | 11/2015 |
| WO | 2010/114126 A1 | 10/2010 |
| WO | 2014/103465 A1 | 7/2014 |
| WO | 2016/208766 A1 | 12/2016 |
| WO | 2017/217490 A1 | 12/2017 |

OTHER PUBLICATIONS

Extended European Search Report received in corresponding European Application No. 18942212.4 dated Apr. 11, 2022.
Chinese Office Action received in corresponding Chinese Application No. 201880098397.9 dated May 6, 2022.
International Search Report of PCT/JP2018/044942 dated Feb. 26, 2019.

CERAMIC SINTERED BODY AND SUBSTRATE FOR SEMICONDUCTOR DEVICE

CROSS-REFERENCE TO RELATED APPLICATION

This application is a continuation application of PCT/JP2018/044942, filed on Dec. 6, 2018, the entire contents of which are incorporated herein by reference.

TECHNICAL FIELD

The present invention relates to a ceramic sintered body and a substrate for a semiconductor device.

BACKGROUND ART

As a substrate for a semiconductor device used for a power transistor module or the like, a DBOC substrate (Direct Bonding of Copper Substrate) including a copper plate on the surface of a ceramic sintered body or a DBOA substrate (Direct Bonding of Aluminum Substrate) including an aluminum plate on the surface of a ceramic sintered body is known.

JP 4717960B discloses a ceramic sintered body containing alumina, partially stabilized zirconia, and magnesia. In the ceramic sintered body described in JP 4717960B, the content of partially stabilized zirconia is 1 to 30 wt %, and the content of magnesia is 0.05 to 0.50 wt %. The molar fraction of yttria in partially stabilized zirconia is 0.015 to 0.035, and 80 to 100% of the zirconia crystals contained in the ceramic sintered body are tetragonal phases. The ceramic sintered body described in JP 4717960B is supposed to be capable of improving the mechanical strength and preventing cracks and voids (partial peeling or floating) from occurring at the bonding interface between the ceramic sintered body and the copper plate or the aluminum plate.

JP 2015-534280A discloses a ceramic sintered body containing alumina, zirconia, and yttria. In the ceramic sintered body described in JP 2015-534280A, the content of zirconia is 2 to 15 wt %, and the average particle size of alumina is 2 to 8 μm. The ceramic sintered body described in JP 2015-534280A is supposed to be capable of improving the thermal conductivity.

WO 2016-208766 discloses a ceramic substrate containing alumina, a stabilizing component, hafnia and zirconia. In the ceramic substrate described in WO 2016-208766, the weight ratio of hafnia and zirconia to alumina is 7 to 11 weight ratio, and the average particle size of alumina is 1.0 to 1.5 μm, and the average particle size of zirconia is 0.3 to 0.5 μm.

The ceramic sintered body described in WO 2016-208766 is supposed to be capable of improving the thermal conductivity.

SUMMARY

However, in the ceramic sintered body described in JP 4717960B, since the each content of Zr, Mg, Si and the balance is not optimized, there is still room for preventing cracks and voids from occurring at the bonding interface.

Since the ceramic sintered body described in JP 2015-534280A does not contain Mg and the ceramic substrate described in WO 2016-208766 does not contain Na or K, there is a limit to improvement of mechanical strength. Further, in the ceramic sintered body described in JP 2015-534280A and the ceramic substrate described in WO 2016-208766, $MgAl_2O_4$ (spinel) crystals are not generated, so that when the copper plate or the aluminum plate is bonded to the ceramic sintered body, there is a problem that the wettability with the Cu—O eutectic liquid phase generated at the bonding interface is lowered and voids are likely to be occurred.

An object of the present invention is to provide a ceramic sintered body and a substrate for a semiconductor device capable of preventing cracks and voids.

A ceramic sintered body according to the present invention is joined to a copper plate or an aluminum plate. In the ceramic sintered body according to the present invention, a Zr content is 17.5 mass % or more and 23.5 mass % or less in terms of $ZrO_2$, and a Hf content is 0.3 mass % or more and 0.5 mass % or less in terms of $HfO_2$, and a Al content is 74.3 mass % or more and 80.9 mass % or less in terms of $Al_2O_3$, and a Y content is 0.8 mass % or more and 1.9 mass % or less in terms of $Y_2O_3$, and a Mg content is 0.1 mass % or more and 0.8 mass % or less in terms of MgO, and a Si content is 0.1 mass % or more and 1.5 mass % or less in terms of $SiO_2$, and a Ca content is 0.03 mass % or more and 0.35 mass % or less in terms of CaO. A total content of Na and K is 0.01 mass % or more and 0.10 mass % or less when the Na content is converted to $Na_2O$ and the K content is converted to $K_2O$. A balance content is 0.05 mass % or less in terms of oxide. A sum of the Mg content in terms of MgO, the Si content in terms of $SiO_2$, the Ca content in terms of CaO, the Na content in terms of $Na_2O$, K content in terms of $K_2O$, and the balance content is 0.3 mass % or more and 2.0 mass % or less.

According to the present invention, it is possible to provide a ceramic sintered body and a substrate for a semiconductor device capable of preventing cracks and voids.

DESCRIPTION OF EMBODIMENTS

Hereinafter, the configuration of a ceramic sintered body according to the present invention and a substrate for a semiconductor device using the same will be described with reference to the drawings.

(Structure of Semiconductor Device 1)

Figure 1:
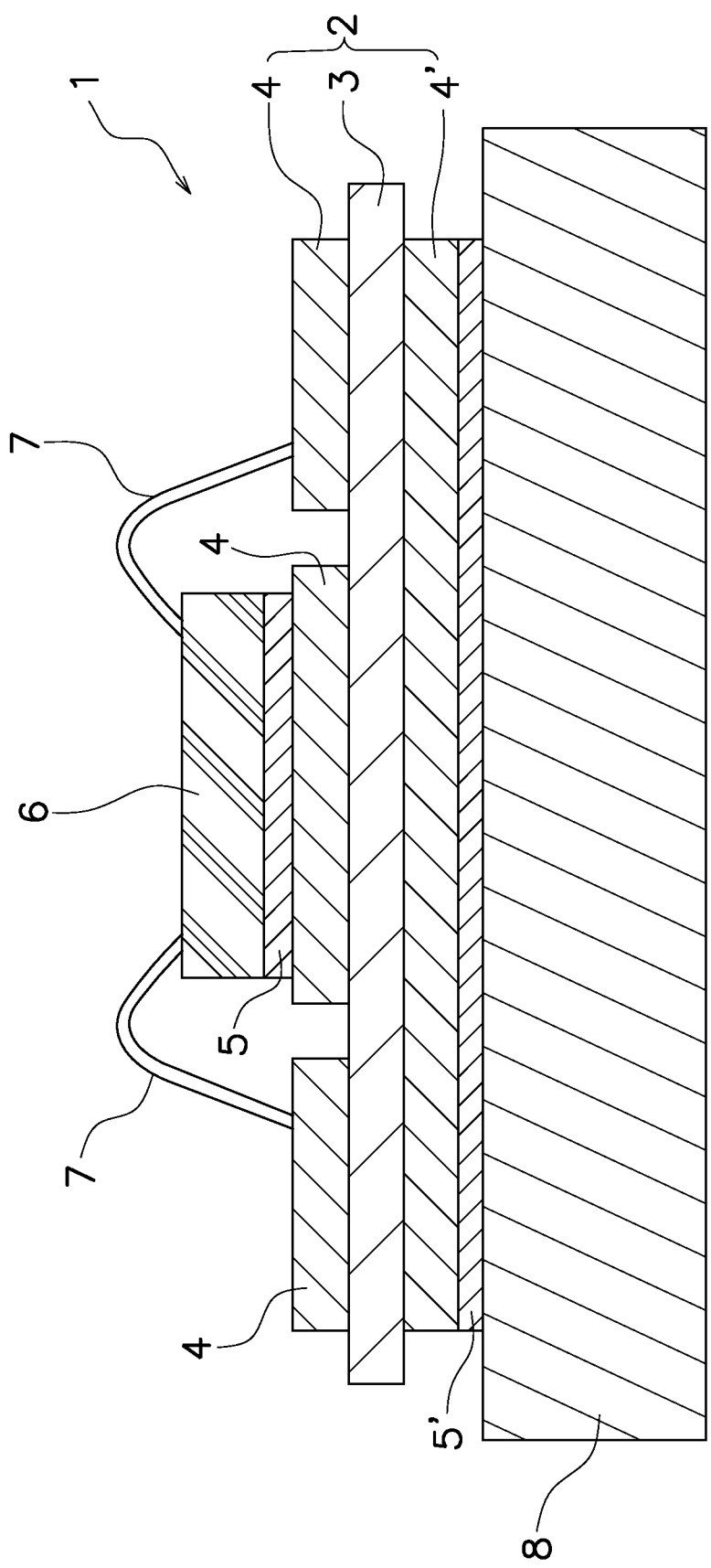
FIG. 1 is a cross-sectional view showing a configuration of a semiconductor device according to an embodiment.

FIG. 1 is a cross-sectional view of a semiconductor device 1 according to the embodiment. The semiconductor device 1 is used as power module in various electronic devices such as an automobile, an air conditioner, an industrial robot, a commercial elevator, a household microwave oven, an IH electric rice cooker, power generation (wind power generation, solar power generation, fuel cell, or the like), electric railway, UPS (uninterruptible power supply) or the like.

The semiconductor device 1 includes a semiconductor device substrate 2, a first bonding material 5, a second bonding material 5', a semiconductor chip 6, a bonding wire 7, and a heat sink 8.

The semiconductor device substrate 2 is a so-called DBOC substrate (Direct Bonding of Copper Substrate). The semiconductor device substrate 2 includes a ceramic sintered body 3, a first copper plate 4, and a second copper plate 4'.

The ceramic sintered body 3 is an insulator for the semiconductor device substrate 2. The ceramic sintered body 3 is formed in a flat plate shape. The ceramic sintered body 3 is a substrate of the semiconductor device substrate 2. The configuration of the ceramic sintered body 3 will be described later.

The first copper plate 4 is joined to the surface of the ceramic sintered body 3. A transmission circuit is formed on the first copper plate 4. The second copper plate 4' is joined to the back surface of the ceramic sintered body 3. The second copper plate 4' is formed in a flat plate shape.

Note that the semiconductor device substrate 2 may be a so-called DBOA substrate (Direct Bonding of Aluminum Substrate) using first and second aluminum plates instead of the first and second copper plates 4 and 4'. In a DBOA substrate using an aluminum plate softer than a copper plate, it is possible to further relax the thermal stress generated inside.

The method for manufacturing the semiconductor device substrate 2 is not particularly limited, and for example, it can be manufactured as follows. First, a laminate in which the first and second copper plates 4 and 4' are arranged on the front and back surfaces of the ceramic sintered body 3 is formed. Next, the laminate is heated for about 10 minutes under nitrogen atmosphere conditions of 1070 degrees C. to 1075 degrees C. As a result, a Cu—O eutectic liquid phase is generated at the interface where the ceramic sintered body 3 and the first and second copper plates 4 and 4' are bonded (hereinafter, collectively referred to as "bonding interface"), and the front and back surfaces of the ceramic sintered body 3 get wet. Next, the Cu—O eutectic liquid phase is solidified by cooling the laminate, and the first and second copper plates 4 and 4' are bonded to the ceramic sintered body 3.

The first copper plate 4 on which a transmission circuit is formed is bonded to the surface of the ceramic sintered body 3 in the semiconductor device substrate 2. The transmission circuit may be formed by a subtractive method or an additive method.

The first bonding material 5 is arranged between the first copper plate 4 and the semiconductor chip 6. The semiconductor chip 6 is bonded to the first copper plate 4 via the first bonding material 5. The bonding wire 7 connects the semiconductor chip 6 and the first copper plate 4.

The second bonding material 5' is arranged between the second copper plate 4' and the heat sink 8. The heat sink 8 is bonded to the second copper plate 4' via the second bonding material 5'. The heat sink 8 can be constituted of copper or the like, for example.

(Structure of Ceramic Sintered Body 3)

The ceramic sintered body 3 includes at least one of Zr (zirconium), Hf (hafnium), Al (aluminum), Y (yttrium), Mg (magnesium), Si (silicon), Ca (calcium), at least one of Na (sodium) and K (potassium), and the balance of other than these.

The contents of the constituent elements of the ceramic sintered body 3 are as follows.

Zr: 17.5 mass % or more and 23.5 mass % or less in terms of $ZrO_2$
Hf: 0.3 mass % or more and 0.5 mass % or less in terms of $HfO_2$
Al: 74.3 mass % or more and 80.9 mass % or less in terms of $Al_2O_3$
Y: 0.8 mass % or more and 1.9 mass % or less in terms of $Y_2O_3$
Mg: 0.1 mass % or more and 0.8 mass % or less in terms of MgO
Si: 0.1 mass % or more and 1.5 mass % or less in terms of $SiO_2$
Ca: 0.03 mass % or more and 0.35 mass % or less in terms of CaO
Na and K: the total content is 0.01 mass % or more and 0.10 mass % or less, when the Na content is converted to $Na_2O$ and the K content is converted to $K_2O$.
Balance: 0.05 mass % or less in terms of oxide
Additives: the sum of the Mg content in terms of MgO, the Si content in terms of $SiO_2$, Ca content in terms of CaO, Na content in terms of $Na_2O$, K content in terms of $K_2O$, and the balance content is 0.3 mass % or more and 2.0 mass % or less.

In this way, by optimizing the types and contents of the constituent elements of the ceramic sintered body 3, the wettability with the Cu—O eutectic liquid phase at the time of copper plate bonding can be improved, so that at the time of copper plate bonding it is possible to prevent voids (partial peeling or floating) from occurring at the bonding interface and increase the mechanical strength of the ceramic sintered body 3. Therefore, even if the ceramic sintered body 3 is subjected to a thermal cycle, it is considered that it is possible to prevent cracks from occurring at the bonding interface. It is considered that such effects are produced by the combination of each constituent element including the content. Although the specific action is not clear, it is considered that the main actions and effects of each constituent element are as follows.

It is considered that by setting the Zr content to 17.5 mass % or more in terms of $ZrO_2$, it is possible to prevent the linear thermal expansion coefficient of the ceramic sintered body 3 from becoming too small, and reduce the difference in the coefficient of linear thermal expansion of the ceramic sintered body 3 and the first and second copper plates 4 and 4'. As a result, it is considered that the thermal stress generated at the joint interface can be reduced, so that it contributes to prevent cracks from occurring at the joint interface.

It is considered that by setting the Zr content to 23.5 mass % or less in terms of $ZrO_2$, it is possible to prevent an excessive reaction at the bonding interface at the time of copper plate bonding and prevent voids from occurring at the bonding interface. This is because the wettability of $Al_2O_3$ and $ZrO_2$ with the Cu—O eutectic liquid phase at the time of copper plate bonding is different.

It is considered that by setting the Hf content to 0.3 mass % or more in terms of $HfO_2$, the heat resistance of the ceramic sintered body 3 can be increased, so that it contributes to prevent pores from forming inside and prevent a decrease in the machine strength of the ceramic sintered body 3.

It is considered that by setting the Hf content to 0.5 mass % or less in terms of $HfO_2$, the ceramic sintered body 3 can be sintered without excessively raising the firing temperature, and the particle sizes of the $Al_2O_3$ particles and the $ZrO_2$ particles are prevented from becoming large (that is, coarsening). As a result, it is considered that the mechanical strength of the ceramic sintered body 3 can be improved, so that it contributes to prevent cracks from occurring at the bonding interface.

It is considered that by setting the Y content to 0.8 mass % or more in terms of $Y_2O_3$, it is possible to prevent an excessive peak intensity ratio of the monoclinic crystal phase among the $ZrO_2$ crystal phases described later. As a result, it is considered that the mechanical strength of the ceramic sintered body 3 can be improved, so that it contributes to prevent cracks from occurring at the bonding interface.

It is considered that by setting the Y content to 1.9 mass % or less in terms of $Y_2O_3$, it is possible to prevent the peak intensity ratio of the monoclinic phase from becoming too small. As a result, it is considered that the mechanical strength of the ceramic sintered body 3 can be improved, so that it contributes to prevent cracks from occurring at the bonding interface.

It is considered that by setting the Mg content to 0.1 mass % or more in terms of MgO, the ceramic sintered body 3 can be sintered without excessively raising the firing temperature, and the coarsening of $Al_2O_3$ particles and $ZrO_2$ particles is prevented. As a result, it is considered that the mechanical strength of the ceramic sintered body 3 can be improved, so that it contributes to prevent cracks from occurring at the bonding interface. Further, it is considered that a sufficient amount of $MgAl_2O_4$ crystals (hereinafter referred to as "spinel crystals") can be generated in the ceramic sintered body 3, and the wettability with the Cu—O eutectic liquid phase at the time of copper plate bonding can be improved. As a result, it is considered that it contributes to prevent voids from occurring at the bonding interface.

It is considered that by setting the Mg content to 0.8 mass % or less in terms of MgO, it is possible to prevent excessive formation of spinel crystals with low mechanical strength, so that it is possible to improve the mechanical strength of the ceramic sintered body 3. As a result, it is considered that it contributes to prevent cracks from occurring at the bonding interface.

It is considered that by setting the Si content to 0.1 mass % or more in terms of $SiO_2$, the ceramic sintered body 3 can be sintered without excessively raising the firing temperature, and the coarsening of $Al_2O_3$ particles and $ZrO_2$ particles is prevented. As a result, it is considered that the mechanical strength of the ceramic sintered body 3 can be improved, so that it contributes to prevent cracks from occurring at the bonding interface.

It is considered that by setting the Si content to 1.5 mass % or less in terms of $SiO_2$, a spinel crystal phase is likely to be formed in the ceramic sintered body 3, and the wettability with the Cu—O eutectic liquid phase at the time of copper plate bonding can be improved. As a result, it is considered that it contributes to prevent voids from occurring at the bonding interface.

It is considered that by setting the Ca content to 0.03 mass % or more and 0.35 mass % or less in terms of CaO, the ceramic sintered body 3 can be sintered without excessively raising the firing temperature, and the coarsening of $Al_2O_3$ particles and $ZrO_2$ particles can be prevented. As a result, it is considered that the mechanical strength of the ceramic sintered body 3 can be improved, so that it contributes to prevent cracks from occurring at the bonding interface.

It is considered that by setting the total content is 0.01 mass % or more when the Na content is converted to $Na_2O$ and the K content is converted to $K_2O$, the ceramic sintered body 3 can be sintered without an excessively high firing temperature, so that the coarsening of $Al_2O_3$ particles and $ZrO_2$ particles can be prevented. As a result, it is considered that the mechanical strength of the ceramic sintered body 3 can be improved, so that it contributes to prevent cracks from occurring at the bonding interface.

It is considered that by setting the total content is 0.10 mass % or less when the Na content is converted to $Na_2O$ and the K content is converted to $K_2O$, it is possible to prevent the body 3 from being excessively sintered and reduce the porosity of the ceramic sintered body 3, although the firing temperature is not excessively raised. As a result, it is considered that the mechanical strength of the ceramic sintered body 3 can be improved, so that it contributes to prevent cracks from occurring at the bonding interface.

It is considered that by setting the content of the balance to 0.05 mass % or less in terms of oxide, it is possible to prevent the ceramic sintered body 3 from being excessively sintered and reduce the porosity of the ceramic sintered body 3 although the firing temperature is not excessively raised. As a result, it is considered that the mechanical strength of the ceramic sintered body 3 can be improved, so that contributes to prevent cracks from occurring at the bonding interface.

It is considered that by setting the sum of the Mg content in terms of MgO, the Si content in terms of $SiO_2$, the Ca content in terms of CaO, the Na content in terms of $Na_2O$, the K content in terms of $K_2O$, and the balance content to 0.3 mass % or more and 2.0 mass % or less, the M phase ratio described later can be put in a suitable range and the mechanical strength of the ceramic sintered body 3 can be improved. As a result, it is considered that it contributes to prevent cracks from occurring at the bonding interface.

Although in the present embodiment, the content of the constituent elements of the ceramic sintered body 3 is calculated in terms of oxide as described above, the constituent elements of the ceramic sintered body 3 may or may not exist in the form of oxide. For example, at least one of Y, Mg and Ca may not exist in the form of an oxide and may be dissolved in $ZrO_2$.

Note that the content of the constituent elements of the ceramic sintered body 3 in terms of oxide is calculated as follows. First, the constituent elements of the ceramic sintered body 3 are qualitatively analyzed using an energy dispersive analyzer (EDS) attached to a fluorescent X-ray analyzer (XRF) or a scanning electron microscope (SEM). Next, each element detected by this qualitative analysis is quantitatively analyzed using an ICP emission spectroscopic analyzer. Next, the content of each element measured by this quantitative analysis is converted into an oxide.

The element contained in the balance may be an element which is intentionally added or an element which is unavoidably mixed. The elements contained in the balance are not particularly limited, and examples thereof include Fe (iron), Ti (titanium), Mn (manganese) or the like.

The ratio of the content of Y in terms of $Y_2O_3$ to the content of Zr in terms of $ZrO_2$ is preferably 4.5% or more and 7.9% or less. As a result, the stability of $ZrO_2$ can be maintained in an appropriate state, and it is considered that it contributes to prevent a decrease in the mechanical strength of the ceramic sintered body 3.

The ceramic sintered body 3 may include an $Al_2O_3$ crystal phase and a $ZrO_2$ crystal phase as the crystal phase. The $ZrO_2$ crystal phase may include a monoclinic phase and a tetragonal phase as a crystal structure. In this case, in the X-ray diffraction pattern, the ratio of the peak intensity of the monoclinic phase to the sum of the peak intensities of each of the monoclinic phase and the tetragonal phase (hereinafter referred to as "M phase ratio") is preferably 12% or less. As a result, the coarsening of $Al_2O_3$ particles and $ZrO_2$ particles can be prevented. Further, since the phase transition from the monoclinic phase to the tetragonal phase is prevented when the ceramic sintered body 3 is heated, it is possible to prevent the volume shrinkage of the ceramic sintered body 3. As a result, since the mechanical strength of the ceramic sintered body 3 can be improved, it is possible to prevent cracks from occurring at the bonding interface even if the ceramic sintered body 3 is subjected to a thermal cycle.

The M phase ratio is more preferably 7% or less. As a result, the mechanical strength of the ceramic sintered body 3 can be further improved, so that it is possible to further prevent cracks from occurring at the bonding interface.

The M phase ratio can be obtained from the following formula (1) using an X-ray diffraction pattern obtained by analyzing the outer surface of the ceramic sintered body 3 with an X-ray diffractometer (XRD: MiniFlexII manufactured by Rigaku Corporation). In the formula (1), M1 is the peak intensity of the monoclinic (111) plane, M2 is the peak intensity of the monoclinic (11-1) plane, and T1 is the peak intensity of the tetragonal (111) plane.

$$\text{Ratio of monoclinic phase} = 100 \times (M1+M2)/(T1+M1+M2) \quad (1)$$

The ceramic sintered body 3 may contain a spinel crystal phase as the crystal phase. In this case, in the X-ray diffraction pattern, the ratio of the peak intensity of $MgAl_2O_4$ to the peak intensity of $Al_2O_3$ (hereinafter referred to as "spinel phase ratio") is preferably 4% or less. As a result, it is possible to prevent an excessive reaction at the bonding interface at the time of copper plate bonding, so that it is possible to prevent voids from occurring at the bonding interface. Note that the spinel phase ratio may be 0%.

The spinel phase ratio is more preferably 0.5% or more and 3.5% or less. As a result, the wettability between the ceramic sintered body 3 and the Cu—O eutectic liquid phase at the time of copper plate bonding can be improved, and the excessive reaction at the bonding interface at the time of copper plate bonding can be further prevented. It is possible to further prevent voids from occurring at the bonding interface.

The spinel phase ratio can be obtained from the following formula (2) using an X-ray diffraction pattern obtained by analyzing the surface of the ceramic sintered body 3 with XRD. In the formula (2), A1 is the peak intensity of the spinel phase (311) plane, and B1 is the peak intensity of the alumina phase (104) plane.

$$\text{Ratio of } MgAl_2O_4(\%) = 100 \times A1/(A1+B1) \quad (2)$$

Although the average particle size of $ZrO_2$ is not particularly limited, it is preferably 0.6 µm or more and 1.5 µm or less. As a result, it is possible to prevent an increase in the M phase ratio due to a decrease in the interfacial energy of the crystal transformation and a decrease in the mechanical strength accompanying the decrease, and it is possible to prevent pores from forming inside the ceramic sintered body 3, so that it is possible to prevent a decrease in mechanical strength.

Although the average particle size of $Al_2O_3$ is not particularly limited, it is preferably 1.6 µm or more and 2.5 µm or less. By setting the average particle size of $Al_2O_3$ to 1.6 µm or more, it is possible to prevent pores from forming inside. By setting the average particle size of $Al_2O_3$ to 2.5 µm or less, the decrease of grain boundaries which become resistance to fracture strength can be prevented, the decrease in the mechanical strength of the ceramic sintered body 3 can be prevented.

The average particle size of each of $ZrO_2$ and $Al_2O_3$ is calculated as follows. First, when the outer surface of the ceramic sintered body 3 is imaged with a scanning electron microscope, the magnification is adjusted so that about 500 to 1000 crystal particles are captured in the entire captured image. Next, using image processing software, the average circle-equivalent diameter of 100 crystal particles randomly selected from the captured image is calculated as the average particle size. The average circle-equivalent diameter is the average value of the circle-equivalent diameter, and the circle-equivalent diameter is the diameter of a circle including the same area as the particles.

(Manufacturing Method of Ceramic Sintered Body 3)

Figure 2:
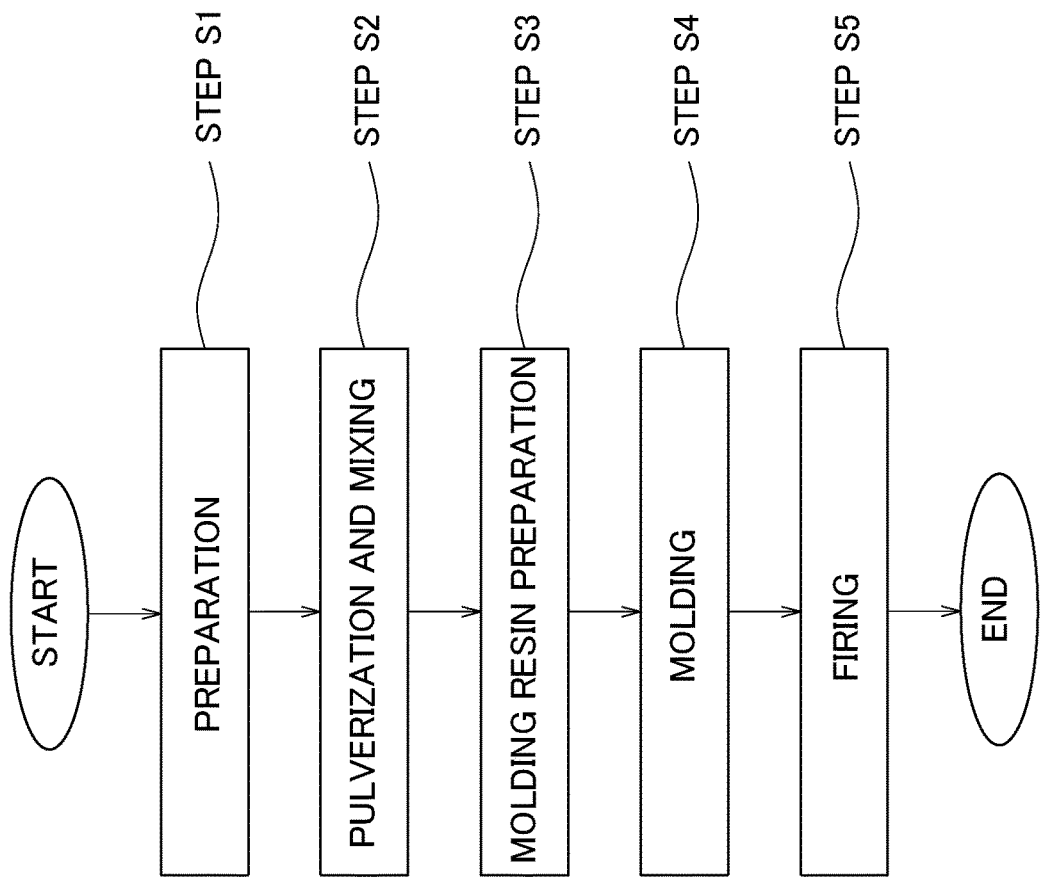
FIG. 2 is a flowchart for explaining a method of manufacturing a substrate for a semiconductor device according to an embodiment.

With reference to FIG. 2, a method for manufacturing the ceramic sintered body 3 will be described. FIG. 2 is a flowchart showing a method for manufacturing the ceramic sintered body 3.

In step S1, the following powder materials are prepared.
$ZrO_2$ of 17.5 mass % or more and 23.5 mass % or less
$HfO_2$ of 0.3 mass % or more and 0.5 mass % or less
$Al_2O_3$ of 74.3 mass % or more and 80.9 mass % or less
$Y_2O_3$ of 0.8 mass % or more and 1.9 mass % or less
MgO of 0.1 mass % or more and 0.8 mass % or less
$SiO_2$ of 0.1 mass % or more and 1.5 mass % or less
CaO of 0.03 mass % or more and 0.35 mass % or less
$Na_2O$; and $K_2O$ in total of 0.01 mass % or more and 0.10 mass % or less
The balance of 0.05 mass % or less
The sum of the Mg content in terms of MgO, the Si content in terms of $SiO_2$, the Ca content in terms of CaO, the Na content in terms of $Na_2O$, the K content in terms of $K_2O$, and the balance content is 0.3 mass % or more and 2.0 mass % or less Note that each of $ZrO_2$, $HfO_2$, and $Y_2O_3$ may be a single powder material or may be $ZrO_2$—$HfO_2$ powder partially stabilized with $Y_2O_3$ in advance. Further, Mg, Ca, and alkali metals (Na and K) may be oxide powders or carbonate powders. When Fe and Mn are contained in the balance, these may be oxide powder or carbonate powder.

In step S2, the prepared powder material is pulverized and mixed by, for example, a ball mill.

In step S3, an organic binder (for example, polyvinyl butyral), a solvent (xylene, toluene, or the like) and a plasticizer (dioctyl phthalate) are added to the pulverized and mixed powder material to form a slurry-like substance.

In step S4, the slurry-like substance is molded into a desired shape by a desired molding means (for example, mold press, cold hydrostatic press, injection molding, doctor blade method, extrusion molding method, or the like) to form a ceramic molded product.

In step S5, the ceramic molded product is fired in an oxygen atmosphere or an air atmosphere (at 1580 degrees C. to 1620 degrees C., 0.7 hours to 1.0 hours).

Example

Figure 3:
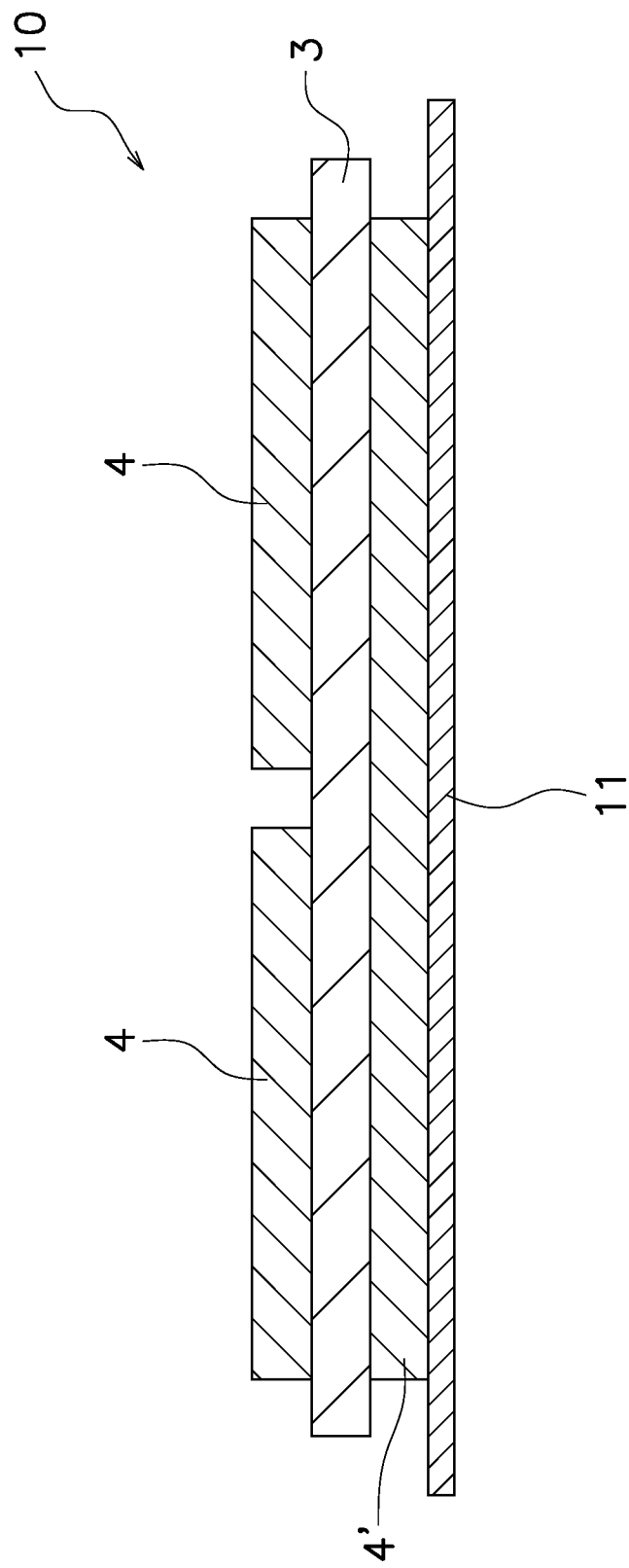
FIG. 3 is a cross-sectional view showing the configuration of a substrate sample for a semiconductor device according to an embodiment.

As illustrated in FIG. 3, when the substrate samples 10 for semiconductor devices according to Examples 1 to 19 and Comparative Examples 1 to 17 are produced, and we observed voids generated at the bonding interface when the copper plates are bonded and cracks generated at the bonding interface when subjected to a thermal cycle.

(Preparation of Substrate Sample 10 for Semiconductor Device)

First, the powder material prepared with the compositions illustrated in Table 1 was pulverized and mixed by a ball mill.

Next, polyvinyl butyral as an organic binder, xylene as a solvent, and dioctyl phthalate as a plasticizer were added to the pulverized and mixed powder material to form a slurry-like substance.

Next, a ceramic molded body was produced by molding a slurry-like substance into a sheet by the doctor blade method.

Next, the ceramic molded product was fired in an air atmosphere at the firing temperature illustrated in Table 1 for 0.8 hours to prepare a ceramic sintered body 3. The size of the ceramic sintered body 3 was 0.32 mm in thickness, 39 mm in length, and 45 mm in width.

Next, the first and second copper plates 4 and 4' (each including a thickness of 0.40 mm) constituted of oxygen-free copper conforming to JIS C1020 are heated to 300 degrees C. in the atmosphere, so that the each outer surface of the first and second copper plates 4 and 4' are oxidized.

Next, a laminate in which the ceramic sintered body 3 is sandwiched between the first and second copper plates 4 and 4' is placed on a mesh material 11 constituted of Mo (molybdenum) and heated at 1070 degrees C. in a nitrogen ($N_2$) atmosphere for 10 minutes.

Next, by cooling the laminate, the first and second copper plates 4 and 4' were joined to the ceramic sintered body 3, and the mesh material 11 was joined to the second copper plate 4'.

(M Phase Rate)

From the above formula (1), the M phase ratio was calculated using the X-ray diffraction pattern obtained by analyzing the outer surface of the ceramic sintered body 3 according to Examples 1 to 19 and Comparative Examples 1 to with XRD (MiniFlexII manufactured by Rigaku Corporation). The calculated M phase ratios are summarized in Table 1.

(Spinel Phase Rate)

From the above formula (2), the spinel phase ratio was calculated using the X-ray diffraction pattern obtained by analyzing the outer surface of the ceramic sintered body 3 according to Examples 1 to 19 and Comparative Examples 1 to 17 with XRD (MiniFlexII manufactured by Rigaku Corporation). The calculated spinel phase ratios are summarized in Table 1.

(Flexural Strength)

The flexural strength (mechanical strength) of the ceramic sintered body 3 according to Examples 1 to 19 and Comparative Examples 1 to 17 was measured by three-point bending strength test (sample size 15×45×thickness 0.32 mm and span 30 mm).

In Table 1, for Examples 1 to 19 and Comparative Examples 1 to 17, the arithmetic mean value of the measured values of 10 pieces each is described as the flexural strength (MPa).

(Void Occurrence Rate)

Substrate samples 10 for semiconductor devices according to Examples 1 to 19 and Comparative Examples 1 to 17 are immersed in water, and the bonding interface between the ceramic sintered body 3 and the first and second copper plates 4 and 4' was observed by ultrasonic microscope, and the presence or absence of voids with a diameter of 2.0 mm or more was confirmed.

In Table 1, for Examples 1 to 19 and Comparative Examples 1 to 17, the percentage of 100 pieces in which voids are observed is illustrated as a void occurrence rate (%). In Table 1, samples including a void occurrence rate (%) of less than 0.2 are evaluated as "⊚", samples of 0.2 or more and less than 0.3 are evaluated as "○", and samples of 0.3 or more and less than 0.5 are evaluated as "Δ", and samples of 0.5 or more are evaluated as "x".

(Crack Occurrence Rate)

Regarding the semiconductor device substrate samples 10 according to Examples 1 to 19 and Comparative Examples 1 to 17, the cycle of "first at −40 degrees C. for 30 minutes, secondly at 25 degrees C. for 5 minutes, thirdly at 125 degrees C. for 30 minutes, and finally at 25 degrees C. for minutes" was repeated until cracks occurred in the ceramic sintered body 3.

In Table 1, for Examples 1 to 19 and Comparative Examples 1 to 17, the number of cycles in which cracks occur in any of the 10 pieces is listed as the number of crack generation cycles. In Table 1, samples with crack occurrence cycles (times) of 101 or more are evaluated as "⊚", samples with 51 or more and 100 or less are evaluated as "○", and samples with 31 or more and 50 or less are evaluated as "Δ", and 30 or less samples are evaluated as "x".

| | Composition (mass %) | | | | | | | | | | | | | | | |
|---|---|---|---|---|---|---|---|---|---|---|---|---|---|---|---|---|
| | $Al_2O_3$ | $ZrO_2$ | $HfO_2$ | $Y_2O_3$ | To $ZrO_2$ | Sub-total | MgO | $SiO_2$ | CaO | $Na_2O$ | $K_2O$ | Sub-total $Na_2O$ + $K_2O$ | Constituent type | | Balance | Sub-total | Total |
| Example 1 | 79.1 | 19.0 | 0.3 | 1.0 | 5.4 | 99.5 | 0.30 | 0.15 | 0.05 | 0.03 | 0.01 | 0.04 | — | — | 0.54 | 100 |
| Example 2 | 79.3 | 19.0 | 0.3 | 1.0 | 5.4 | 99.7 | 0.10 | 0.15 | 0.05 | 0.03 | 0.01 | 0.04 | — | — | 0.34 | 100 |
| Example 3 | 79.2 | 19.0 | 0.3 | 1.0 | 5.4 | 99.6 | 0.15 | 0.15 | 0.05 | 0.03 | 0.01 | 0.04 | — | — | 0.39 | 100 |
| Example 4 | 78.6 | 19.0 | 0.3 | 1.0 | 5.4 | 99.0 | 0.75 | 0.15 | 0.05 | 0.03 | 0.01 | 0.04 | — | — | 0.99 | 100 |
| Example 5 | 79.1 | 19.0 | 0.3 | 1.0 | 5.4 | 99.5 | 0.30 | 0.10 | 0.05 | 0.03 | 0.01 | 0.04 | — | — | 0.49 | 100 |
| Example 6 | 77.9 | 19.0 | 0.3 | 1.0 | 5.4 | 98.3 | 0.30 | 1.30 | 0.05 | 0.03 | 0.01 | 0.04 | — | — | 1.69 | 100 |
| Example 7 | 79.1 | 19.0 | 0.3 | 1.0 | 5.4 | 99.5 | 0.30 | 0.15 | 0.03 | 0.03 | 0.01 | 0.04 | — | — | 0.52 | 100 |
| Example 8 | 78.8 | 19.0 | 0.3 | 1.0 | 5.4 | 99.2 | 0.30 | 0.15 | 0.34 | 0.03 | 0.01 | 0.04 | — | — | 0.83 | 100 |
| Example 9 | 79.1 | 19.0 | 0.3 | 1.0 | 5.4 | 99.5 | 0.30 | 0.15 | 0.05 | 0.02 | — | 0.02 | — | — | 0.52 | 100 |
| Example 10 | 79.0 | 19.0 | 0.3 | 1.0 | 5.4 | 99.4 | 0.30 | 0.15 | 0.05 | 1.09 | — | 0.09 | — | — | 0.59 | 100 |
| Example 11 | 79.3 | 19.0 | 0.3 | 1.0 | 5.4 | 99.7 | 0.20 | 0.10 | 0.03 | 0.01 | — | 0.01 | — | — | 0.34 | 100 |
| Example 12 | 77.6 | 19.0 | 0.3 | 1.0 | 5.4 | 98.0 | 0.53 | 1.20 | 0.20 | 0.06 | 0.01 | 0.07 | — | — | 2.00 | 100 |
| Example 13 | 79.1 | 19.0 | 0.3 | 1.0 | 5.4 | 99.5 | 0.30 | 0.15 | 0.05 | 0.03 | 0.01 | 0.04 | MnO / $TiO_2$ / $Fe_2O_3$ | 0.03 / 0.01 / 0.01 | — | 0.54 | 100 |
| Example 14 | 80.7 | 17.5 | 0.3 | 0.9 | 5.4 | 99.5 | 0.30 | 0.15 | 0.05 | 0.03 | 0.01 | 0.04 | — | — | 0.54 | 100 |
| Example 15 | 80.9 | 17.5 | 0.3 | 0.8 | 4.5 | 99.5 | 0.30 | 0.15 | 0.05 | 0.03 | 0.01 | 0.04 | — | — | 0.54 | 100 |
| Example 16 | 74.3 | 23.5 | 0.4 | 1.3 | 5.4 | 99.5 | 0.30 | 0.15 | 0.05 | 0.03 | 0.01 | 0.04 | — | — | 0.54 | 100 |
| Example 17 | 79.3 | 19.0 | 0.3 | 0.9 | 4.5 | 99.5 | 0.30 | 0.15 | 0.05 | 0.03 | 0.01 | 0.04 | — | — | 0.54 | 100 |
| Example 18 | 79.5 | 19.0 | 0.3 | 0.9 | 4.5 | 99.7 | 0.10 | 0.15 | 0.05 | 0.03 | 0.01 | 0.04 | — | — | 0.34 | 100 |
| Example 19 | 78.6 | 19.0 | 0.3 | 1.5 | 7.9 | 99.5 | 0.30 | 0.15 | 0.05 | 0.03 | 0.01 | 0.04 | — | — | 0.54 | 100 |
| Comparative Example 1 | 83.4 | 15.0 | 0.3 | 0.8 | 5.4 | 99.5 | 0.30 | 0.15 | 0.05 | 0.03 | 0.01 | 0.04 | — | — | 0.54 | 100 |

-continued

| | | | | | | | | | | | | | | | | |
|---|---|---|---|---|---|---|---|---|---|---|---|---|---|---|---|---|
| Comparative Example 2 | 72.7 | 25.0 | 0.5 | 1.4 | 5.4 | 99.5 | 0.30 | 0.15 | 0.05 | 0.03 | 0.01 | 0.04 | — | — | 0.54 | 100 |
| Comparative Example 3 | 79.3 | 19.0 | 0.3 | 1.0 | 5.4 | 99.7 | 0.05 | 0.15 | 0.05 | 0.03 | 0.01 | 0.04 | — | — | 0.29 | 100 |
| Comparative Example 4 | 78.4 | 19.0 | 0.3 | 1.0 | 5.4 | 98.8 | 1.00 | 0.15 | 0.05 | 0.03 | 0.01 | 0.04 | — | — | 1.24 | 100 |
| Comparative Example 5 | 79.2 | 19.0 | 0.3 | 1.0 | 5.4 | 99.6 | 0.30 | 0.06 | 0.05 | 0.03 | 0.01 | 0.04 | — | — | 0.45 | 100 |
| Comparative Example 6 | 77.4 | 19.0 | 0.3 | 1.0 | 5.4 | 97.8 | 0.30 | 1.80 | 0.05 | 0.03 | 0.01 | 0.04 | — | — | 2.19 | 100 |
| Comparative Example 7 | 79.1 | 19.0 | 0.3 | 1.0 | 5.4 | 99.5 | 0.30 | 0.15 | 0.01 | 0.03 | 0.01 | 0.04 | — | — | 0.50 | 100 |
| Comparative Example 8 | 78.7 | 19.0 | 0.3 | 1.0 | 5.4 | 99.1 | 0.30 | 0.15 | 0.43 | 0.03 | 0.01 | 0.04 | — | — | 0.92 | 100 |
| Comparative Example 9 | 79.1 | 19.0 | 0.3 | 1.0 | 5.4 | 99.5 | 0.30 | 0.15 | 0.05 | — | — | 0.00 | — | — | 0.50 | 100 |
| Comparative Example 10 | 79.0 | 19.0 | 0.3 | 1.0 | 5.4 | 99.4 | 0.30 | 0.15 | 0.05 | 0.12 | 0.02 | 0.14 | — | — | 0.64 | 100 |
| Comparative Example 11 | 79.4 | 19.0 | 0.3 | 1.0 | 5.4 | 99.8 | 0.10 | 0.10 | 0.03 | 0.01 | — | 0.01 | — | — | 0.24 | 100 |
| Comparative Example 12 | 77.1 | 19.0 | 0.3 | 1.0 | 5.4 | 97.5 | 0.30 | 0.15 | 0.05 | 0.03 | 0.01 | 0.04 | — | — | 2.50 | 100 |
| Comparative Example 13 | 79.1 | 19.0 | 0.3 | 1.0 | 5.4 | 99.4 | 0.30 | 0.15 | 0.05 | 0.03 | 0.01 | 0.04 | MnO Fe$_2$O$_3$ | 0.10 0.02 | 0.58 | 100 |
| Comparative Example 14 | 80.8 | 17.5 | 0.2 | 0.9 | 5.4 | 99.5 | 0.30 | 0.15 | 0.05 | 0.03 | 0.01 | 0.04 | — | — | 0.54 | 100 |
| Comparative Example 15 | 74.1 | 23.5 | 0.6 | 1.3 | 5.4 | 99.5 | 0.30 | 0.15 | 0.05 | 0.03 | 0.01 | 0.04 | — | — | 0.54 | 100 |
| Comparative Example 16 | 79.4 | 19.0 | 0.3 | 0.7 | 3.6 | 99.5 | 0.30 | 0.15 | 0.05 | 0.03 | 0.01 | 0.04 | — | — | 0.54 | 100 |
| Comparative Example 17 | 73.5 | 23.5 | 0.4 | 2.1 | 8.8 | 99.5 | 0.30 | 0.15 | 0.05 | 0.03 | 0.01 | 0.04 | — | — | 0.54 | 100 |

| | | Characteristics | | | | | | |
|---|---|---|---|---|---|---|---|---|
| | | Ceramic sintered body | | | | | Substrate for semiconductor device | |
| | Firing temperature | Crystal grain size (μm) | | M phase rate | Spinel phase rate | Flexural strength | Void occurrence | Number of crack generation cycles |
| | (degrees C.) | Al$_2$O$_3$ | ZrO$_2$ | (%) | (%) | (MPa) | rate (%) | (Times) |
| Example 1 | 1580 | 2.0 | 0.7 | 2.0 | 1.8 | 690 | 0.6 | ◯ | 150 | ◎ |
| Example 2 | 1600 | 2.2 | 1.1 | 3.2 | 0.0 | 680 | 1.2 | △ | 75 | ◯ |
| Example 3 | 1600 | 2.2 | 1.2 | 3.5 | 1.0 | 675 | 0.9 | △ | 125 | ◎ |
| Example 4 | 1600 | 2.3 | 1.4 | 3.8 | 3.0 | 670 | 0.2 | ◎ | 100 | ◯ |
| Example 5 | 1600 | 1.9 | 0.9 | 2.1 | 2.0 | 700 | 0.6 | ◯ | 100 | ◯ |
| Example 6 | 1580 | 2.3 | 1.3 | 2.5 | 0.0 | 690 | 1.2 | △ | 85 | ◯ |
| Example 7 | 1620 | 2.5 | 1.5 | 4.0 | 2.6 | 650 | 0.6 | ◯ | 100 | ◯ |
| Example 8 | 1620 | 2.4 | 1.5 | 3.5 | 2.8 | 660 | 0.5 | ◯ | 125 | ◎ |
| Example 9 | 1620 | 2.3 | 1.3 | 1.9 | 1.9 | 650 | 0.6 | ◯ | 75 | ◯ |
| Example 10 | 1580 | 2.4 | 1.4 | 1.8 | 2.0 | 650 | 0.6 | ◯ | 85 | ◯ |
| Example 11 | 1600 | 1.8 | 0.9 | 1.5 | 1.5 | 660 | 0.3 | ◎ | 85 | ◯ |
| Example 12 | 1580 | 2.5 | 1.5 | 4.5 | 3.4 | 670 | 0.1 | ◎ | 100 | ◯ |
| Example 13 | 1580 | 2.5 | 1.4 | 3.7 | 1.8 | 675 | 0.6 | ◯ | 85 | ◯ |
| Example 14 | 1580 | 1.7 | 0.7 | 1.2 | 2.3 | 675 | 0.3 | ◎ | 75 | ◯ |
| Example 15 | 1580 | 1.7 | 0.9 | 15.0 | 2.2 | 600 | 0.6 | ◯ | 40 | △ |
| Example 16 | 1580 | 1.8 | 0.8 | 1.5 | 2.6 | 735 | 0.3 | ◎ | 150 | ◎ |
| Example 17 | 1600 | 2.3 | 1.3 | 6.9 | 2.8 | 650 | 0.3 | ◎ | 40 | △ |
| Example 18 | 1620 | 2.8 | 2.0 | 12.0 | 0.0 | 630 | 1.2 | △ | 50 | △ |
| Example 19 | 1600 | 2.4 | 1.1 | 1.5 | 2.0 | 660 | 0.3 | ◎ | 50 | △ |
| Comparative Example 1 | 1580 | 1.7 | 0.7 | 1.0 | 2.1 | 620 | 0.6 | ◯ | 20 | X |
| Comparative Example 2 | 1580 | 2.0 | 0.8 | 1.2 | 2.3 | 750 | 4.8 | X | 175 | ◎ |
| Comparative Example 3 | 1620 | 2.7 | 2.0 | 9.0 | 0.0 | 640 | 1.8 | X | 25 | X |
| Comparative Example 4 | 1580 | 3.0 | 2.2 | 7.0 | 4.5 | 630 | 0.1 | ◎ | 25 | X |
| Comparative Example 5 | 1620 | 2.8 | 1.8 | 6.0 | 1.2 | 620 | 0.9 | △ | 30 | X |
| Comparative Example 6 | 1580 | 3.5 | 2.2 | 9.0 | 0.0 | 610 | 4.5 | X | 75 | ◯ |
| Comparative Example 7 | 1620 | 2.8 | 2.5 | 7.0 | 2.3 | 600 | 1.2 | △ | 20 | X |
| Comparative Example 8 | 1620 | 2.6 | 2.0 | 5.0 | 1.8 | 580 | 0.6 | ◯ | 25 | X |
| Comparative Example 9 | 1620 | 3.0 | 1.9 | 6.0 | 2.6 | 590 | 0.9 | △ | 20 | X |
| Comparative Example 10 | 1580 | 2.6 | 1.7 | 1.5 | 0.5 | 660 | 6.0 | X | 85 | ◯ |
| Comparative Example 11 | 1620 | 3.0 | 1.8 | 12.0 | 0.0 | 620 | 0.9 | △ | 20 | X |
| Comparative Example 12 | 1580 | 3.5 | 2.2 | 11.0 | 3.0 | 630 | 9.0 | X | 15 | X |
| Comparative Example 13 | 1580 | 3.2 | 2.1 | 10.0 | 2.5 | 640 | 1.2 | △ | 25 | X |
| Comparative Example 14 | 1580 | 1.8 | 0.9 | 9.0 | 2.0 | 590 | 0.5 | ◯ | 30 | X |

-continued

| | | | | | | | | | | |
|---|---|---|---|---|---|---|---|---|---|---|
| Comparative Example 15 | 1620 | 3.0 | 2.8 | 14.0 | 2.6 | 610 | 0.6 | ○ | 30 | X |
| Comparative Example 16 | 1600 | 2.1 | 1.2 | 15.0 | 2.6 | 550 | 0.6 | ○ | 15 | X |
| Comparative Example 17 | 1600 | 2.3 | 1.4 | 1.0 | 2.2 | 560 | 0.9 | Δ | 20 | X |

As illustrated in Table 1, in Examples 1 to 19 in which the content of the constituent elements in the ceramic sintered body 3 was optimized as follows, voids at the bonding interface could be prevented and cracks could be prevented from occurring at the bonding interface.

Zr: 17.5 mass % or more and 23.5 mass % or less in terms of $ZrO_2$
Hf: 0.3 mass % or more and 0.5 mass % or less in terms of $HfO_2$
Al: 74.3 mass % or more and 80.9 mass % or less in terms of $Al_2O_3$
Y: 0.8 mass % or more and 1.9 mass % or less in terms of $Y_2O_3$
Mg: 0.1 mass % or more and 0.8 mass % or less in terms of MgO
Si: 0.1 mass % or more and 1.5 mass % or less in terms of $SiO_2$
Ca: 0.03 mass % or more and 0.35 mass % or less in terms of CaO
Na and K: When the Na content is converted to $Na_2O$ and the K content is converted to $K_2O$, the total content is 0.01 mass % or more and 0.10 mass % or less.
Balance: 0.05 mass % or less in terms of oxide
Additives: The sum of the Mg content in terms of MgO, the Si content in terms of $SiO_2$, the Ca content in terms of CaO, the Na content in terms of $Na_2O$, the K content in terms of $K_2O$, and the balance content is 0.3 mass % or more and 2.0 mass % or less.

The invention claimed is:

1. A ceramic sintered body joined to a copper plate or an aluminum plate, wherein
a Zr content is 17.5 mass % or more and 23.5 mass % or less in terms of $ZrO_2$,
an Hf content is 0.3 mass % or more and 0.5 mass % or less in terms of $HfO_2$,
an Al content is 74.3 mass % or more and 80.9 mass % or less in terms of $Al_2O_3$,
a Y content is 0.8 mass % or more and 1.9 mass % or less in terms of $Y_2O_3$,
an Mg content is 0.1 mass % or more and 0.8 mass % or less in terms of MgO,
a Si content is 0.1 mass % or more and 1.5 mass % or less in terms of $SiO_2$,
a Ca content is 0.03 mass % or more and 0.35 mass % or less in terms of CaO,
a total content of Na and K is 0.01 mass % or more and 0.10 mass % or less when the Na content is converted to $Na_2O$ and the K content is converted to $K_2O$,
a balance content is 0.05 mass % or less in terms of oxide, and
a sum of the Mg content in terms of MgO, the Si content in terms of $SiO_2$, the Ca content in terms of CaO, the Na content in terms of $Na_2O$, the K content in terms of $K_2O$, and the balance content is 0.3 mass % or more and 2.0 mass % or less.

2. The ceramic sintered body according to claim 1 containing an $Al_2O_3$ crystal phase and a $ZrO_2$ crystal phase as crystal phases, wherein
the $ZrO_2$ crystal phase contains a monoclinic phase and a tetragonal phase as crystal structures,
a ratio of a peak intensity of the monoclinic phase to a sum of the peak intensity of the monoclinic phase and a peak intensity of the tetragonal phase is 12% or less in a X-ray diffraction pattern.

3. The ceramic sintered body according to claim 1 containing an $Al_2O_3$ crystal phase and a $ZrO_2$ crystal phase as crystal phases, wherein
the $ZrO_2$ crystal phase contains a monoclinic phase and a tetragonal phase as crystal structures,
a ratio of a peak intensity of the monoclinic phase to a sum of the peak intensity of the monoclinic phase and a peak intensity of the tetragonal phase is 7% or less in a X-ray diffraction pattern.

4. The ceramic sintered body according to claim 1 containing $MgAl_2O_4$ crystal phase as a crystal phase, wherein
a ratio of a peak intensity of $MgAl_2O_4$ to a peak intensity of $Al_2O_3$ is 4% or less in a X-ray diffraction pattern.

5. The ceramic sintered body according to claim 1 containing $MgAl_2O_4$ crystal phase as a crystal phase, wherein
a ratio of a peak intensity of $MgAl_2O_4$ to a peak intensity of $Al_2O_3$ is 0.5% or more and 3.5% or less in a X-ray diffraction pattern.

6. The ceramic sintered body according to claim 1, wherein
an average particle size of $ZrO_2$ is 0.6 μm or more and 1.5 μm or less.

7. The ceramic sintered body according to claim 1, wherein
an average particle size of $Al_2O_3$ is 1.6 μm or more and 2.5 μm or less.

8. The ceramic sintered body according to claim 1, wherein
a ratio of the Y content in terms of $Y_2O_3$ to the Zr content in terms of $ZrO_2$ is 4.5% or more and 7.9% or less.

9. A substrate for a semiconductor device on which electronic components mounted, the substrate comprising:
a ceramic sintered body; and
a copper plate or an aluminum plate joined to the ceramic sintered body, wherein
in the ceramic sintered body,
a Zr content is 17.5 mass % or more and 23.5 mass % or less in terms of $ZrO_2$,
an Hf content is 0.3 mass % or more and 0.5 mass % or less in terms of $HfO_2$,
an Al content is 74.3 mass % or more and 80.9 mass % or less in terms of $Al_2O_3$,
a Y content is 0.8 mass % or more and 1.9 mass % or less in terms of $Y_2O_3$,
an Mg content is 0.1 mass % or more and 0.8 mass % or less in terms of MgO,
an Si content is 0.1 mass % or more and 1.5 mass % or less in terms of $SiO_2$,
a Ca content is 0.03 mass % or more and 0.35 mass % or less in terms of CaO,
a total content of Na and K is 0.01 mass % or more and 0.10 mass % or less when the Na content is converted to $Na_2O$ and the K content is converted to $K_2O$,
a balance content is 0.05 mass % or less in terms of oxide, and a sum of the Mg content in terms of MgO, the Si content in terms of $SiO_2$, the Ca content in terms of CaO, the Na content in terms of $Na_2O$, the K content in terms of $K_2O$, and the balance content is 0.3 mass % or more and 2.0 mass % or less.

* * * * *